(12) United States Patent
Uppili et al.

(10) Patent No.: US 12,464,742 B2
(45) Date of Patent: Nov. 4, 2025

(54) VERTICAL DIODE CONFIGURATIONS FOR RADIATION-ENVIRONMENT APPLICATIONS

(71) Applicant: SCDevice LLC, Portland, OR (US)

(72) Inventors: Sudarsan Uppili, Portland, OR (US); Scott Joseph Alberhasky, Hillsboro, OR (US); David Lee Snyder, Beaverton, OR (US)

(73) Assignee: SCDevice LLC, Portland, OR (US)

( * ) Notice: Subject to any disclaimer, the term of this patent is extended or adjusted under 35 U.S.C. 154(b) by 466 days.

(21) Appl. No.: 18/088,501

(22) Filed: Dec. 23, 2022

(65) Prior Publication Data

US 2023/0207706 A1    Jun. 29, 2023

Related U.S. Application Data

(60) Provisional application No. 63/293,372, filed on Dec. 23, 2021.

(51) Int. Cl.
*H10D 8/60* (2025.01)
*H10D 62/10* (2025.01)
*H10D 64/62* (2025.01)
*H10D 64/64* (2025.01)

(52) U.S. Cl.
CPC ............. *H10D 8/60* (2025.01); *H10D 62/126* (2025.01); *H10D 64/62* (2025.01); *H10D 64/64* (2025.01)

(58) Field of Classification Search
CPC ........ H10D 8/60; H10D 62/126; H10D 64/62; H10D 64/64
USPC ........................................................ 257/471
See application file for complete search history.

(56) References Cited

U.S. PATENT DOCUMENTS

2020/0295174 A1*   9/2020  Sabri ................... H10D 64/512

OTHER PUBLICATIONS

F. Dahlquist, Junction Barrier Schottky Rectifiers in Silicon Carbide, KTH, Royal Institute of Technology Department of Microelectronics and Information Technology, Stockholm, 2002.

* cited by examiner

*Primary Examiner* — Monica D Harrison
(74) *Attorney, Agent, or Firm* — Daylight Law, P.C.

(57) ABSTRACT

Vertical diodes are disclosed herein for radiation-environment applications. The diodes can be junction barrier Schottky (JBS) diodes. A disclosed vertical diode includes a first region with a first conductivity type, fingers with a second conductivity type and located in a top portion of the first region, at least one tap region with the first conductivity type formed in the fingers, and a metal layer located over and in contact with the first region and the fingers and forming a Schottky barrier with the first region. Another disclosed vertical diode includes a first region with a first conductivity type, fingers with a second conductivity type located in a top portion of the first region and having a well doping concentration, and a metal layer located over the first region and the fingers and forming a Schottky barrier with the first region.

17 Claims, 12 Drawing Sheets

VERTICAL DIODE CONFIGURATIONS FOR RADIATION-ENVIRONMENT APPLICATIONS

CROSS REFERENCE TO RELATED APPLICATIONS

This application claims the benefit of U.S. Provisional Patent Application No. 63/293,372, filed Dec. 23, 2021, which is incorporated by reference herein in its entirety for all purposes.

BACKGROUND

Vertical diodes are devices with current conduction through a bulk layer of the semiconductor substrate in which they are formed. The current is conducted vertically perpendicular to a main surface of the substrate as opposed to laterally in parallel with such surface. Vertical diodes generally have higher breakdown voltages and the ability to handle higher on currents when compared to horizontal diodes. Vertical diodes are applied in numerous applications including in power converters, power regulators, power switches, signal isolators, and signal mixers.

Junction barrier Schottky (JBS) diodes are diodes that combine aspects of traditional Schottky diodes and PiN diodes. Schottky diodes are formed by the interface of a metal material with a semiconductor material and have low forward voltage drops but can be prone to reverse bias leakage. The metal material can be referred to as a Schottky metal layer. A JBS diode includes a Schottky metal layer, which serves as the anode of the diode, formed over strips of highly doped p-type semiconductor material (i.e., P+ material). A JBS diode also includes a bulk layer such as a lightly doped n-type semiconductor material (i.e., N− material) formed epitaxially on a substrate which is in contact with the Schottky metal layer to form the Schottky barrier of the diode. An electrical contact to the bulk layer can serve as the cathode contact of the device.

SUMMARY

Vertical diodes are disclosed herein for radiation-environment applications. The diodes can be junction barrier Schottky (JBS) diodes. JBS diodes can fail in radiation-environment applications for various reasons. For example, during the off-state ion bombardment of the device can cause a buildup of electrons in the heavily doped semiconductor material which thereby forms a high electric field and potential overheating of the JBS diode. As another example, the highly doped semiconductor material regions of traditional JBS diodes are formed by heavy implants which cause crystal defects that are prone to interacting with the heavy ion bombardment associated with radiation environments which causes device leakages. These and other problems associated with traditional JBS diodes are solved by some of the specific embodiments of the diodes disclosed herein.

In specific embodiments of the inventions disclosed herein, the diodes disclosed herein exhibit various features selected from: a single event burnout (SEB) resistance of greater than 400 volts, a 1200 volt to 2200 volts breakdown voltage, a nominal forward current rating of 1 ampere to 40 amperes, a forward bias voltage of less than 2 volts with a current of 100 amperes per centimeter squared, and a specific on resistance in milliohms per centimeter squared of less than 5.

Regions of devices having different conductivity types will be disclosed herein. References to a "first conductivity type" and a "second conductivity type" refer to opposite conductivity types (i.e., the first conductivity type is n-type and the second conductivity type is p-type or vice versa). Areas that have a strong n-type or p-type characteristic such as through relatively heavy doping compared to other semiconductor regions in the same device can be referred to as N+ or P+ regions. Areas that have a weaker n-type or p-type characteristic such as through relatively lighter doping as compared to other semiconductor regions in the same device can be referred to as N− or P− regions. References to p-wells, n-wells, wells, well doping, n-drift, p-drift, drift regions and drift region doping, should be interpreted according to how those terms are understood by those of ordinary skill in the art unless otherwise more specifically specified.

In specific embodiments of the inventions disclosed herein, a vertical diode is provided. The vertical diode comprises a first region with a first conductivity type, a set of fingers with a second conductivity type and located in a top portion of the first region, at least one tap region with the first conductivity type formed in the set of fingers, and a metal layer. The metal layer is located over and is in contact with the first region, is located over and is in contact with the set of fingers, and forms a Schottky barrier with the first region of the first conductivity type.

In specific embodiments of the inventions disclosed herein, a vertical diode is provided. The vertical diode comprises a first region with a first conductivity type, a set of fingers with a second conductivity type located in a top portion of the first region and having a well doping concentration, and a metal layer located over the first region and the set of fingers and forming a Schottky barrier with the first region.

In specific embodiments of the inventions disclosed herein, a vertical diode is provided. The vertical diode comprises an n-drift region, a set of P+ fingers formed in the n-drift region, at least one N+ region formed in the set of P+ fingers, and a metal layer located over the n-drift region, located over the set of P+ fingers, and forming a Schottky barrier with the n-drift region.

DETAILED DESCRIPTION

The vertical junction diodes disclosed herein can be formed in silicon carbide, silicon, or other semiconductor substrates. The vertical junction diodes can include regions of a first conductivity type and regions of a second, opposite, conductivity type. The regions of different conductivity can be formed by doping the substrate materials with various dopants such as aluminum and nitrogen for silicon carbide, and boron, phosphorus, and arsenic for silicon. Example levels of conductivity types provided with reference to a well dopant region formed in a drift region and a heavily doped region (i.e., N+ or P+ region) formed in a drift region on a substrate include: a P+ or N+ region at $5\times10^{18}$ cm$^{-3}$ to $1\times10^{20}$ cm$^{-3}$, a p-well region (well doping or PW) at $1\times10^{17}$ cm$^{-3}$ to $4\times10^{18}$ cm$^{-3}$, and an n-drift region at $1\times10^{15}$ cm$^{-3}$ to $5\times10^{16}$ cm$^{-3}$.

The vertical junction diodes disclosed herein can be Schottky diodes formed through the interface of a metal layer with the semiconductor materials mentioned above. The metals can be titanium or nickel silicide for silicon carbide, or cobalt silicide or nickel silicide for silicon.

The various materials that form the vertical diodes can be deposited through various methods such as by plasma-assisted sputtering, physical vapor deposition, evaporation, chemical vapor deposition, and atomic layer deposition. The methods can be conducted with or without subsequent thermal reaction with substrate depending on the material.

The vertical diodes disclosed herein can include sets of fingers, as illustrated. The finger widths can be between 2 microns and 5 microns. The space between the fingers can be between 1 micron and 3 microns. The lengths of the fingers can be between 100 microns and 500 microns.

The vertical diodes disclosed herein can have a first region with a first conductivity type and a set of fingers with a second conductivity type located in a top portion of the first region. The first region can be any semiconductor region that is grounded or that can otherwise serve as a terminal of a diode. The first region can be an epitaxy region formed on a substrate. The first region can alternatively be a lightly doped top region on a substrate. A metal layer formed over and in contact with the first region can form a Schottky barrier with the first region and can serve as an alternative terminal of the diode from the substrate. For example, if the first region is n-type the substrate can serve as the cathode of the diode and the metal layer can serve as the anode.

Figure 1:
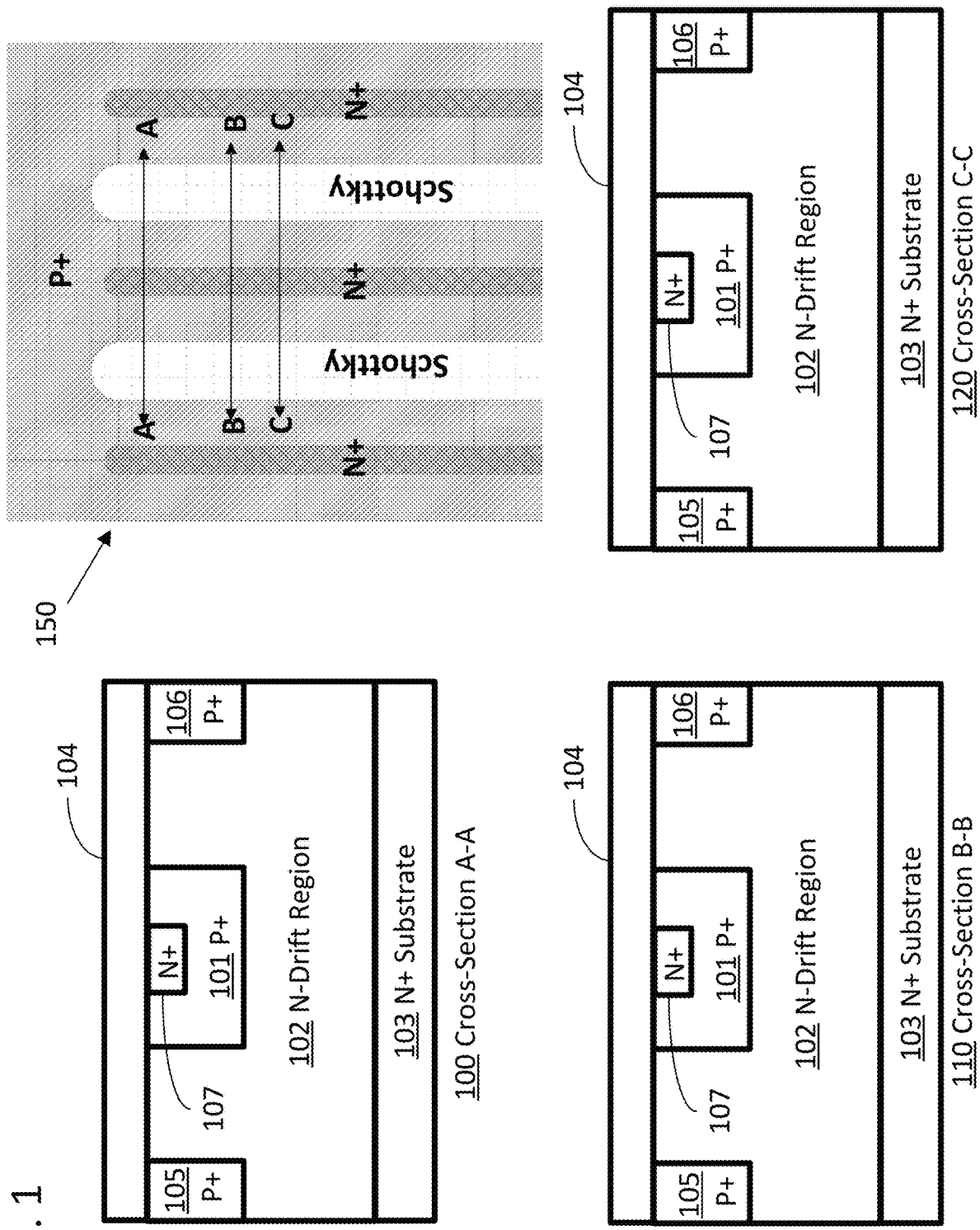
FIG. 1 includes a top-down view and three cross sections of a vertical diode device having a set of tap region strips in accordance with specific embodiments of the inventions disclosed herein.

In the case of a diode with an n-type first region, the fingers can be regions of P+ material, such as region 101, region 105, and region 106 in cross section 100 in FIG. 1, formed in a top portion of an n-drift region, such as region 102 in cross section 100 in FIG. 1. In the case of FIG. 1, region 102 is electrically connected to N+ substrate 103 which serves as the cathode of the diode. The first region can have a light dopant concentration relative to the dopant concentration of the fingers. The fingers in the set of fingers can have a P+ or N+ concentration of $5\times10^{18}$ cm$^{-3}$ to $1\times10^{20}$ cm$^{-3}$. The first region can have an opposing N− or P− dopant concentration of $1\times10^{15}$ cm$^{-3}$ to $5\times10^{16}$ cm$^{-3}$.

The vertical diodes disclosed herein can have Schottky barriers formed between the set of fingers and a metal layer, and between the first region with the first conductivity type and a metal layer. For example, in FIG. 1, a Schottky barrier is formed by the interface of metal layer 104 and n-drift region 102 where the metal layer 104 is over and in contact with n-drift region 102. The n-drift region 102 serves as the "first region" in this example. In operation, the diode can be forward biased by applying a positive voltage to metal layer 104 as compared to the voltage of substrate 103 such that the diode is on and such that current will flow vertically through the device between the fingers from the metal layer through to the substrate with a low voltage drop across the junction of the metal layer 104 and the n-drift region 102. The diode can furthermore be negatively biased by applying a zero or negative voltage to metal layer 104 as compared to the voltage of substrate 103 such that the diode is off. In such a situation, a depletion region will extend between the fingers in the set of fingers of the diode through the first region and under the Schottky barrier between the metal layer 104 and the n-drift region 102.

The vertical diodes disclosed herein can have at least one tap region with a first conductivity type which is formed in the set of fingers. The first conductivity type can be the opposite conductivity type as that of the fingers in the set of fingers and can be the same as the conductivity type of the first region in which the fingers are formed. The tap regions can have various characteristics. The tap regions can be a set of tap region strips of material formed in the fingers. The tap regions can be a set of tap region islands formed in the fingers. The tap regions can be isolated from the first region by the fingers. The strips can be isolated strips of material that span the length of the finger in which they are formed and are surrounded by the finger in the set of fingers on three sides. For example, in FIG. 1 tap region 107 is surrounded by region 101 on its two sides and bottom side. The islands can be smaller regions of material that do not span the length of the finger in which they are formed and are surrounded by finger in the set of fingers on five sides. For example, in FIG. 3 tap region 307 is, as seen in top-down view 350, surrounded by region 301 on its two sides, bottom sides, and front and back sides. The tap regions can take up less than an entire width of the finger in which they are formed. For example, the tap regions can take up less than a third or less than a fourth of the width of the finger in which they are formed. The strips can be in a one-to-one correspondence with the fingers (i.e., one strip in each finger). The islands can be in a many-to-one correspondence with the fingers (i.e., multiple islands in each finger). During an ion event, the tap regions can provide continuous taps for carriers in the fingers and reduce the electric field (and hence lessen the temperature rise) close to the device surface when the device is biased in the off-state. Thus, the device's radiation resistance is strengthened by preventing it from overheating.

FIG. 1 includes a top-down view 150 and three cross sections of a vertical diode device having a set of tap region strips in accordance with specific embodiments of the inventions disclosed herein. The cross sections include cross section 100 along line A-A in top-down view 150, cross section 110 along line B-B in top-down view 150, and cross section 120 along line C-C in top-down view 150. When the device is biased in the off-state, a depletion region extends from the P+(e.g., region 101, region 105, and region 106) through the N- epi (e.g., region 102) under the Schottky contact. During an ion event, the N+ strips (e.g., region 107) incorporated in the P+ region (e.g., region 101) provide continuous N+ taps for electrons and reduce the electric field (and hence lessen the temperature rise) close to the anode surface when the device is biased in the off-state. Thus, the device's radiation resistance is strengthened by preventing it from overheating. The N+ strips are an example of a tap region. The tap region or tap regions can have a dopant concentration of $5 \times 10^{18}$ cm$^{-3}$ to $1 \times 10^{20}$ cm$^{-3}$.

In specific embodiments of the inventions disclosed herein, the vertical diodes can include at least one ohmic contact region which contacts either one or more fingers, one or more tap regions, or both. The ohmic contact region can improve the surge current protection of the device by allowing charge to impact the fingers more easily and to thereby form the depletion region mentioned above more quickly. The at least one ohmic contact region can be over and in contact with the at least one tap region such as in the example illustrated in FIG. 2. The at least one ohmic contact region can be located over and in contact with the set of fingers such as in the example illustrated in FIG. 2. The ohmic contact region can be formed in the metal layer mentioned above. The metal layer is a mixed metal layer having a first metal in the at least one ohmic contact region and a second metal that forms the Schottky barrier with the first region of the vertical diode. For example, the first metal could be nickel on silicon carbide and the second metal could be titanium on silicon carbide.

Figure 2:
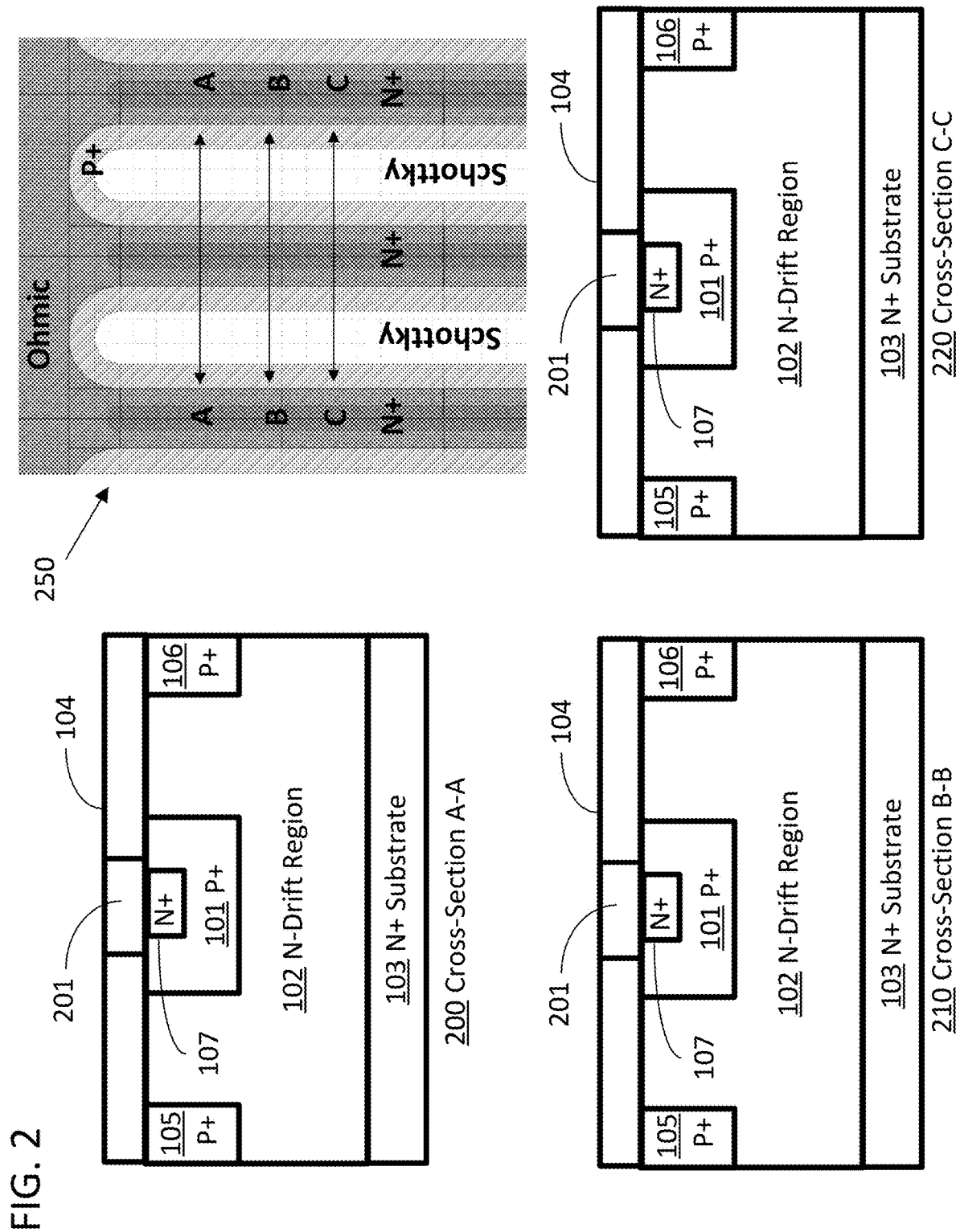
FIG. 2 includes a top-down view and three cross sections of a vertical diode device having a set of tap region strips with ohmic contacts in accordance with specific embodiments of the inventions disclosed herein.

FIG. 2 includes a top-down view 250 and three cross sections of a vertical diode device having a set of tap region strips and ohmic contacts in accordance with specific embodiments of the inventions disclosed herein. The cross sections include cross section 200 along line A-A in top-down view 250, cross section 210 along line B-B in top-down view 250, and cross section 220 along line C-C in top-down view 150. When the device is biased in the off-state, a depletion region extends from the P+(e.g., region 101, region 105, and region 106) through the N- epi (e.g., region 102) under the Schottky contact. During an ion event, the N+ strips (e.g., region 107) incorporated in the P+ region (e.g., region 101) provide continuous N+ taps for electrons and reduce the electric field (and hence lessen the temperature rise) close to the anode surface when the device is biased in the off-state. Thus, the device's radiation resistance is strengthened by preventing it from overheating. The N+ strips are an example of a tap region. The tap region or tap regions can have a dopant concentration of $5 \times 10^{18}$ cm$^{-3}$ to $1 \times 10^{20}$ cm$^{-3}$. Furthermore, in this example, improved surge current performance is achieved by using ohmic contacts on the P+ and N+ regions (e.g., ohmic contact region 201).

Figure 3:
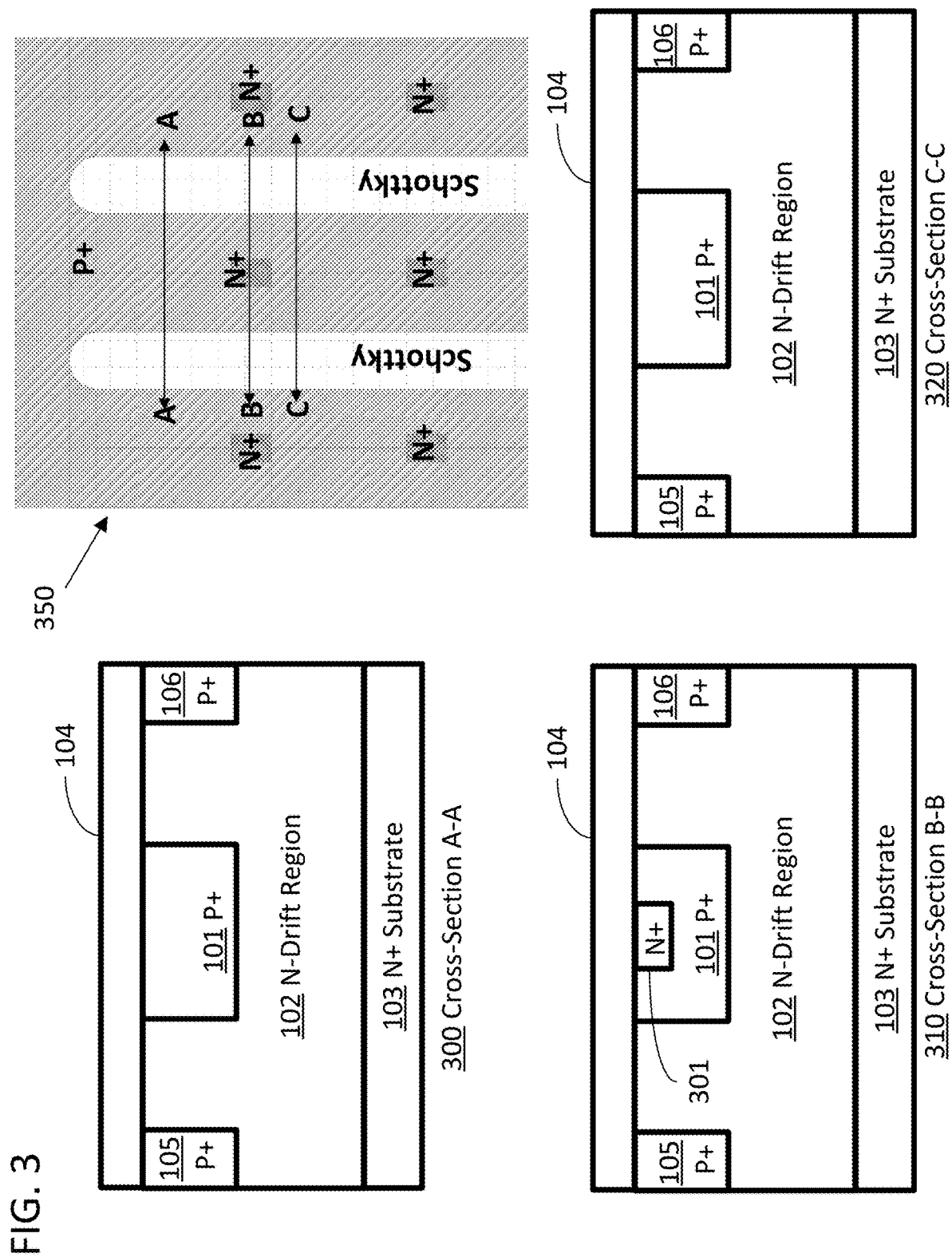
FIG. 3 includes a top-down view and three cross sections of a vertical diode device having a set of tap region islands in accordance with specific embodiments of the inventions disclosed herein.

FIG. 3 includes a top-down view 350 and three cross sections of a vertical diode device having a set of tap region islands in accordance with specific embodiments of the inventions disclosed herein. The cross sections include cross section 300 along line A-A in top-down view 350, cross section 310 along line B-B in top-down view 350, and cross section 320 along line C-C in top-down view 350. When the device is biased in the off-state, a depletion region extends from the P+(e.g., region 101, region 105, and region 106) through the N- epi (e.g., region 102) under the Schottky contact. Furthermore, during an ion event, the N+ islands (e.g., region 301) incorporated in the P+ region (e.g., region 101) provide periodic N+ taps for electrons and reduce the electric field (and hence lessen the temperature rise) close to the anode surface when the device is biased in the off-state. Thus, the device's radiation resistance is strengthened by preventing it from overheating. The islands trade off reduced resistance of the P+ region for reduced radiation hardening as compared to the example of N+ strips described above.

Figure 4:
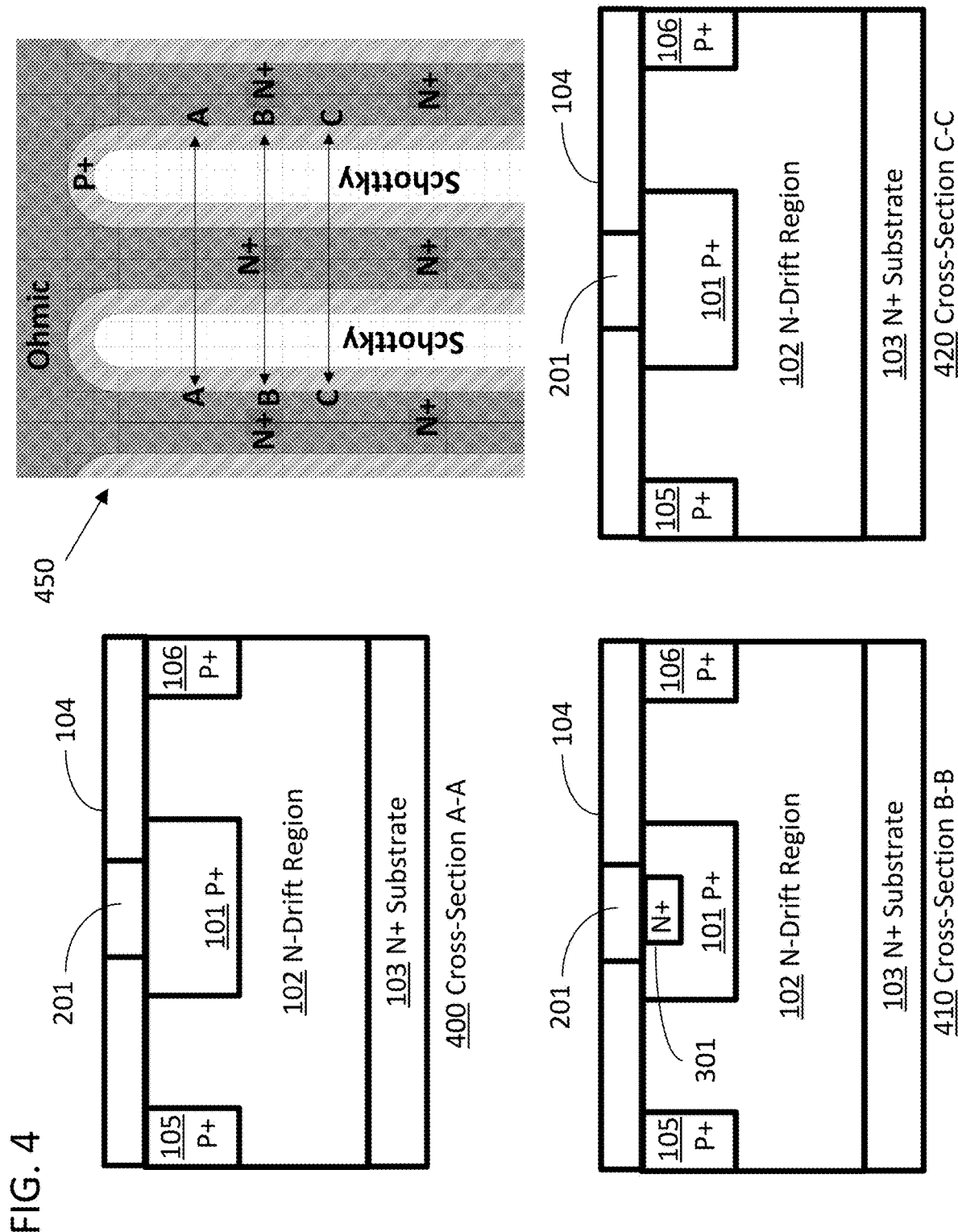
FIG. 4 includes a top-down view and three cross sections of a vertical diode device having a set of tap region islands with ohmic contacts in accordance with specific embodiments of the inventions disclosed herein.

FIG. 4 includes a top-down view 450 and three cross sections of a vertical diode device having a set of tap region islands and ohmic contacts in accordance with specific embodiments of the inventions disclosed herein. The cross sections include cross section 400 along line A-A in top-down view 450, cross section 410 along line B-B in top-down view 450, and cross section 420 along line C-C in top-down view 450. When the device is biased in the off-state, a depletion region extends from the P+(e.g., region 101, region 105, and region 106) through the N- epi (e.g., region 102) under the Schottky contact. Furthermore, during an ion event, the N+ islands (e.g., region 301) incorporated in the P+ region (e.g., region 101) provide periodic N+ taps for electrons and reduce the electric field (and hence lessen the temperature rise) close to the anode surface when the device is biased in the off-state. The islands trade off reduced resistance of the P+ region for reduced radiation hardening as compared to the example of P+ strips described above. Furthermore, in this example, improved surge current performance is achieved by using ohmic contacts on the P+ and N+ regions (e.g., ohmic contact region 201).

In specific embodiments of the inventions disclosed herein, a vertical diode is provided with lightly doped p-well fingers in place of the P+ fingers in the junction barrier diode layouts described above. For example, the concentration of p-type dopants in a p-well could range from $1 \times 10^{17}$ cm$^{-3}$ to $4 \times 10^{18}$ cm$^{-3}$, which is more than an order of magnitude lower than the P+ concentrations mentioned in the examples above. To produce a lower p-well dopant concentration, the ion implant dose is lowered. Crystal damage caused by ion implant is minimized when the ion dose is reduced. Devices that have less crystal damage are more likely to withstand the impacts of radiation. As such, the p-well region could serve the same purposes as the P+ fingers described in the examples above while improving the radiation hardening of the device overall.

Figure 5:
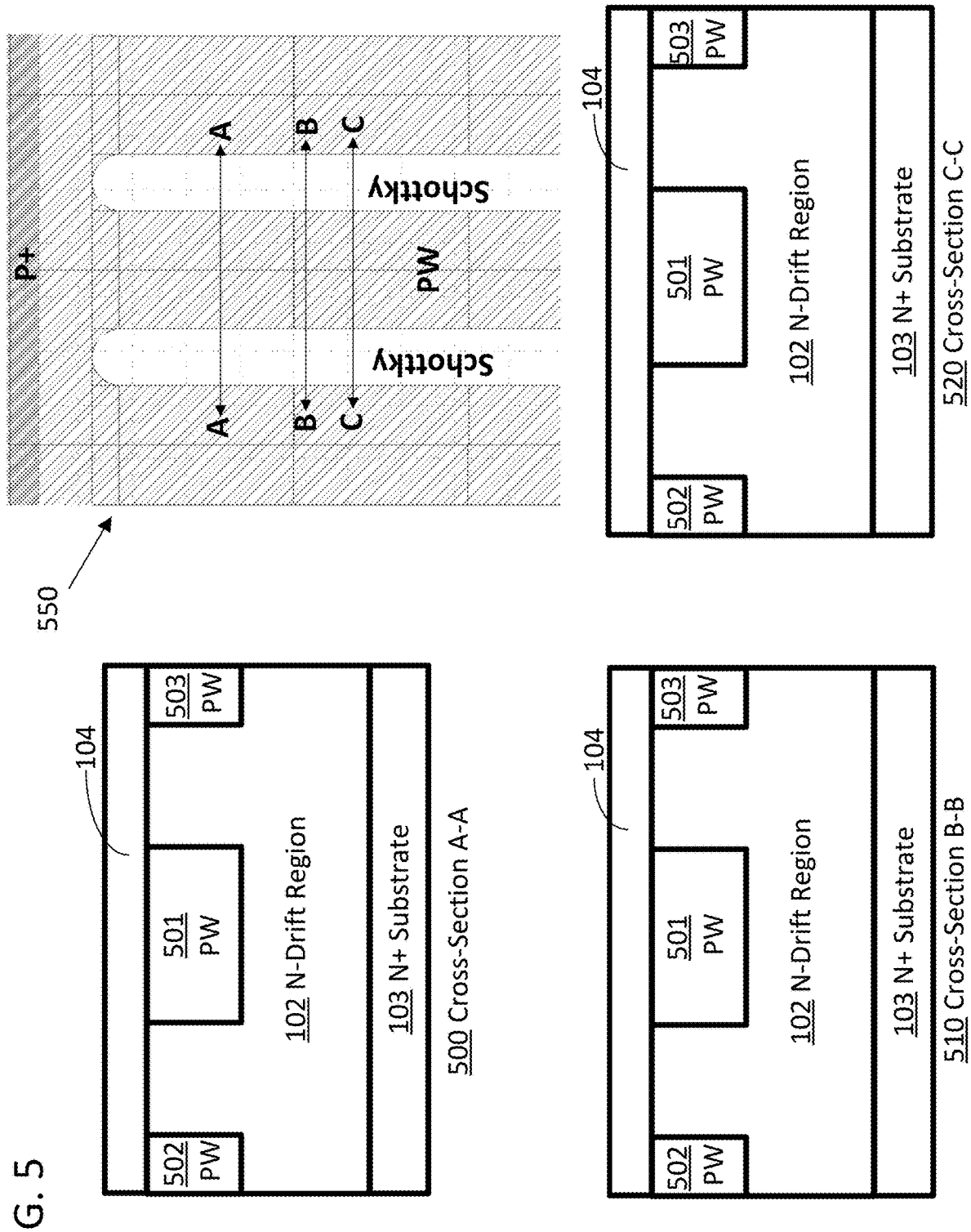
FIG. 5 includes a top-down view and three cross sections of a vertical diode device having a set of fingers with well doping concentration in accordance with specific embodiments of the inventions disclosed herein.

In specific embodiments of the inventions disclosed herein, vertical diodes could include a first region with a first conductivity type (e.g., an n-type region such as n-drift region 102 in FIG. 5) and a set of fingers with a second conductivity type, located in a top portion of the first region, and having a well doping concentration (e.g., a p-well region such as p-well region 501 in FIG. 5). The first region with the first conductivity type could have a dopant concentration of $1\times10^{15}$ cm$^{-3}$ to $5\times10^{16}$ cm$^{-3}$. The well doping concentration could be $1\times10^{17}$ cm$^{-3}$ to $4\times10^{18}$ cm$^{-3}$. While the example of p-well fingers is provided as an example herein, a similar effect could be achieved by using alternative light doping schemes which did not cause crystal defects when being formed in or on the first region. The vertical diodes could include a metal layer located over the first region and the set of p-well fingers and forming a Schottky barrier with the first region. The metal layer could form a Schottky barrier with an entire top surface of the set of p-well fingers along a cross section of the vertical diode.

FIG. 5 includes a top-down view 550 and three cross sections of a vertical diode device having a set of fingers with well doping concentration in accordance with specific embodiments of the inventions disclosed herein. The cross sections include cross section 500 along line A-A in top-down view 550, cross section 510 along line B-B in top-down view 550, and cross section 520 along line C-C in top-down view 550. In other vertical diodes, P+ doped and Schottky fingers alternate, and in the P+ regions, high implant dosages are necessary to reach dopant concentrations of $5\times10^{18}$ cm$^{-3}$ to $1\times10^{20}$ cm$^{-3}$. These heavy implants cause crystal defects at such high concentrations, which are prone to interacting with heavy ions, exacerbating the defects and possibly contributing to increased device leakage. This design uses lightly doped p-well fingers (e.g., region 501, region 502, and region 503) instead of P+ fingers in the junction barrier diode layout. The p-well fingers can be biased by a common connection to a more heavily doped region such as the P+ region shown in cross section 550. The concentration of p-type dopants in a p-well ranges from $1\times10^{17}$ cm$^{-3}$ to $4\times10^{18}$ cm$^{-3}$, which is more than an order of magnitude lower than the average P+ concentration. To produce a lower p-well dopant concentration, the ion implant dose is lowered. Crystal damage caused by ion implant is minimized when the ion dose is reduced. Devices that have less crystal damage are more likely to withstand the impacts of radiation. When the device is biased in the off-state, a depletion region extends from the p-well fingers (e.g., region 501, region 502, and region 503) through the N− epi (e.g., region 102) under the Schottky contact. The p-well region fingers therefore provide a similar effect to that of the P+ fingers of the approaches described above.

Figure 6:
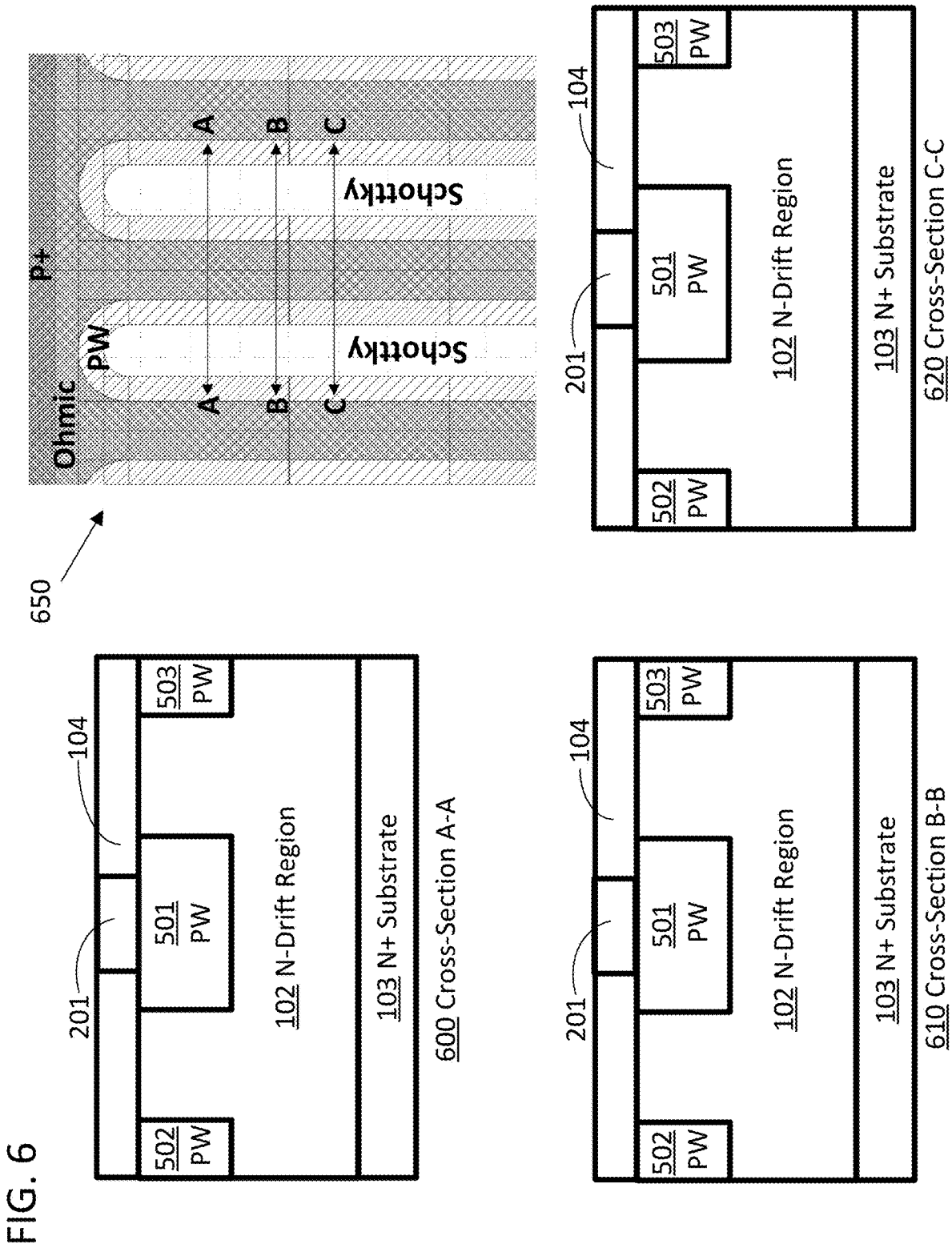
FIG. 6 includes a top-down view and three cross sections of a vertical diode device having a set of fingers with well doping concentration and ohmic contacts in accordance with specific embodiments of the inventions disclosed herein.

FIG. 6 includes a top-down view 650 and three cross sections of a vertical diode device having a set of fingers with well doping concentration and ohmic contacts in accordance with specific embodiments of the inventions disclosed herein. The cross sections include cross section 600 along line A-A in top-down view 650, cross section 610 along line B-B in top-down view 650, and cross section 620 along line C-C in top-down view 650. In other vertical diodes, P+ doped and Schottky fingers alternate, and in the P+ regions, high implant dosages are necessary to reach dopant concentrations of $5\times10^{18}$ cm$^{-3}$ to $1\times10^{20}$ cm$^{-3}$. These heavy implants cause crystal defects at such high concentrations, which are prone to interacting with heavy ions, exacerbating the defects and possibly contributing to increased device leakage. This design uses lightly doped p-well fingers (e.g., region 501, region 502, and region 503) instead of P+ fingers in the junction barrier diode layout. The p-well fingers can be biased by a common connection to a more heavily doped region such as the P+ region shown in cross section 650. The concentration of p-type dopants in a p-well ranges from $1\times10^{17}$ cm$^{-3}$ to $4\times10^{18}$ cm$^{-3}$, which is more than an order of magnitude lower than the average P+ concentration. To produce a lower p-well dopant concentration, the ion implant dose is lowered. Crystal damage caused by ion implant is minimized when the ion dose is reduced. Devices that have less crystal damage are more likely to withstand the impacts of radiation. When the device is biased in the off-state, a depletion region extends from the p-well fingers (e.g., region 501, region 502, and region 503) through the N− epi (e.g., region 102) under the Schottky contact. The p-well region fingers therefore provide a similar effect to that of the P+ fingers of the approaches described above. Furthermore, in this example, improved surge current performance is achieved by using ohmic contacts on the p-well regions (e.g., ohmic contact region 201).

Figure 7:
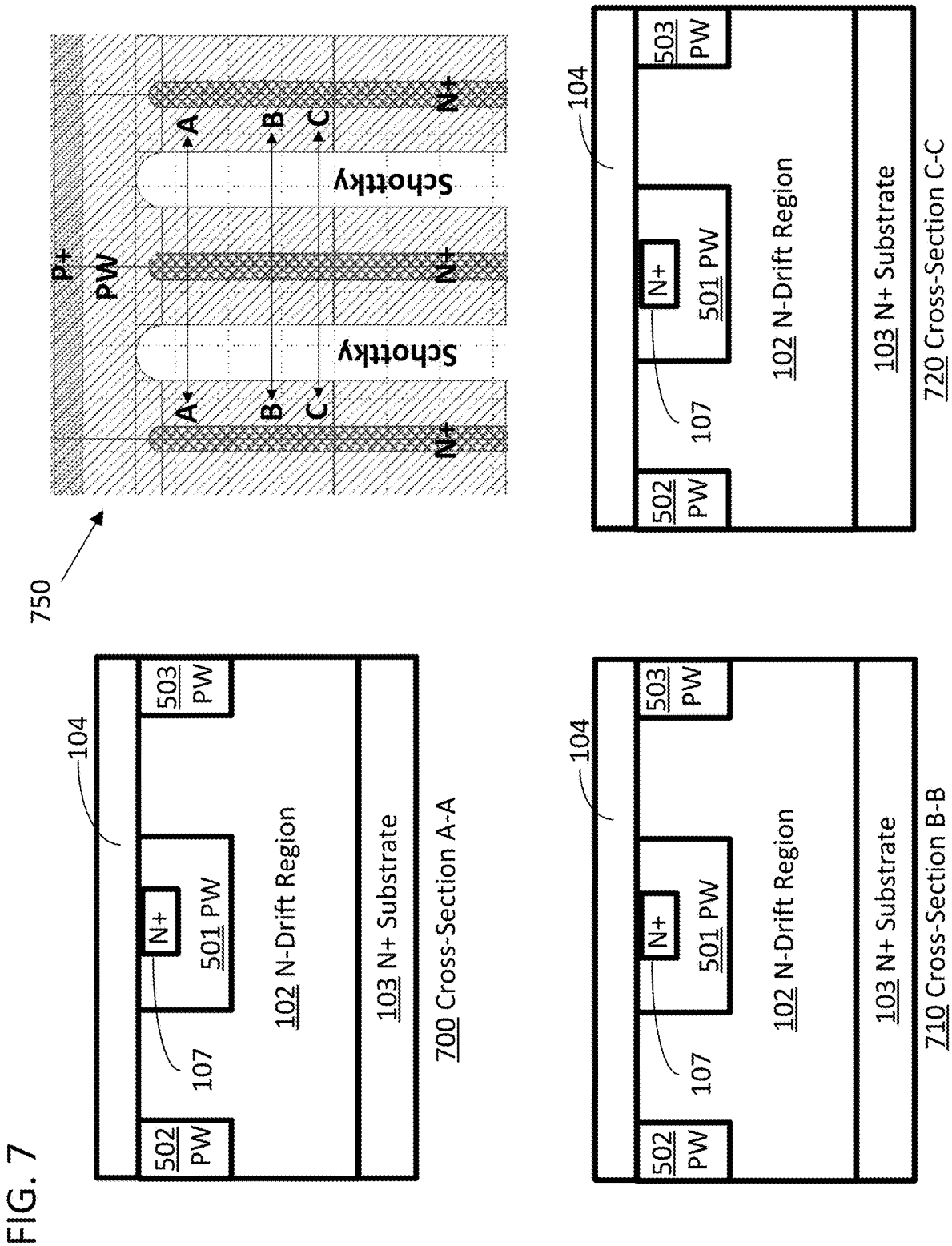
FIG. 7 includes a top-down view and three cross sections of a vertical diode device having a set of fingers with well doping concentration and a set of tap region strips in accordance with specific embodiments of the inventions disclosed herein.

FIG. 7 includes a top-down view 750 and three cross sections of a vertical diode device having a set of fingers with well doping concentration and a set of tap region strips in accordance with specific embodiments of the inventions disclosed herein. The cross sections include cross section 700 along line A-A in top-down view 750, cross section 710 along line B-B in top-down view 750, and cross section 720 along line C-C in top-down view 750. In other vertical diodes, P+ doped and Schottky fingers alternate, and in the P+ regions, high implant dosages are necessary to reach dopant concentrations of $5\times10^{18}$ cm$^{-3}$ to $1\times10^{20}$ cm$^{-3}$. These heavy implants cause crystal defects at such high concentrations, which are prone to interacting with heavy ions, exacerbating the defects and possibly contributing to increased device leakage. This design uses lightly doped p-well fingers (e.g., region 501, region 502, and region 503) instead of P+ fingers in the junction barrier diode layout. The p-well fingers can be biased by a common connection to a more heavily doped region such as the P+ region shown in cross section 750. The concentration of p-type dopants in a p-well ranges from $1\times10^{17}$ cm$^{-3}$ to $4\times10^{18}$ cm$^{-3}$, which is more than an order of magnitude lower than the average P+ concentration. To produce a lower p-well dopant concentration, the ion implant dose is lowered. Crystal damage caused by ion implant is minimized when the ion dose is reduced. Devices that have less crystal damage are more likely to withstand the impacts of radiation. When the device is biased in the off-state, a depletion region extends from the p-well fingers (e.g., region 501, region 502, and region 503) through the N− epi (e.g., region 102) under the Schottky contact. The p-well region fingers therefore provide a similar effect to that of the P+ fingers of the approaches described above. Furthermore, during an ion event, the N+ strips (e.g., region 107) incorporated in the p-well fingers (e.g., region 501) provide continuous N+ taps for electrons and reduce the electric field (and hence lessen the temperature rise) close to the anode surface when the device is biased in the off-state. Thus, the device's radiation resistance is strengthened by preventing it from overheating. The N+ strips are an example of a tap region. The tap region or tap regions can have a dopant concentration of $5\times10^{18}$ cm$^{-3}$ to $1\times10^{20}$ cm$^{-3}$.

Figure 8:
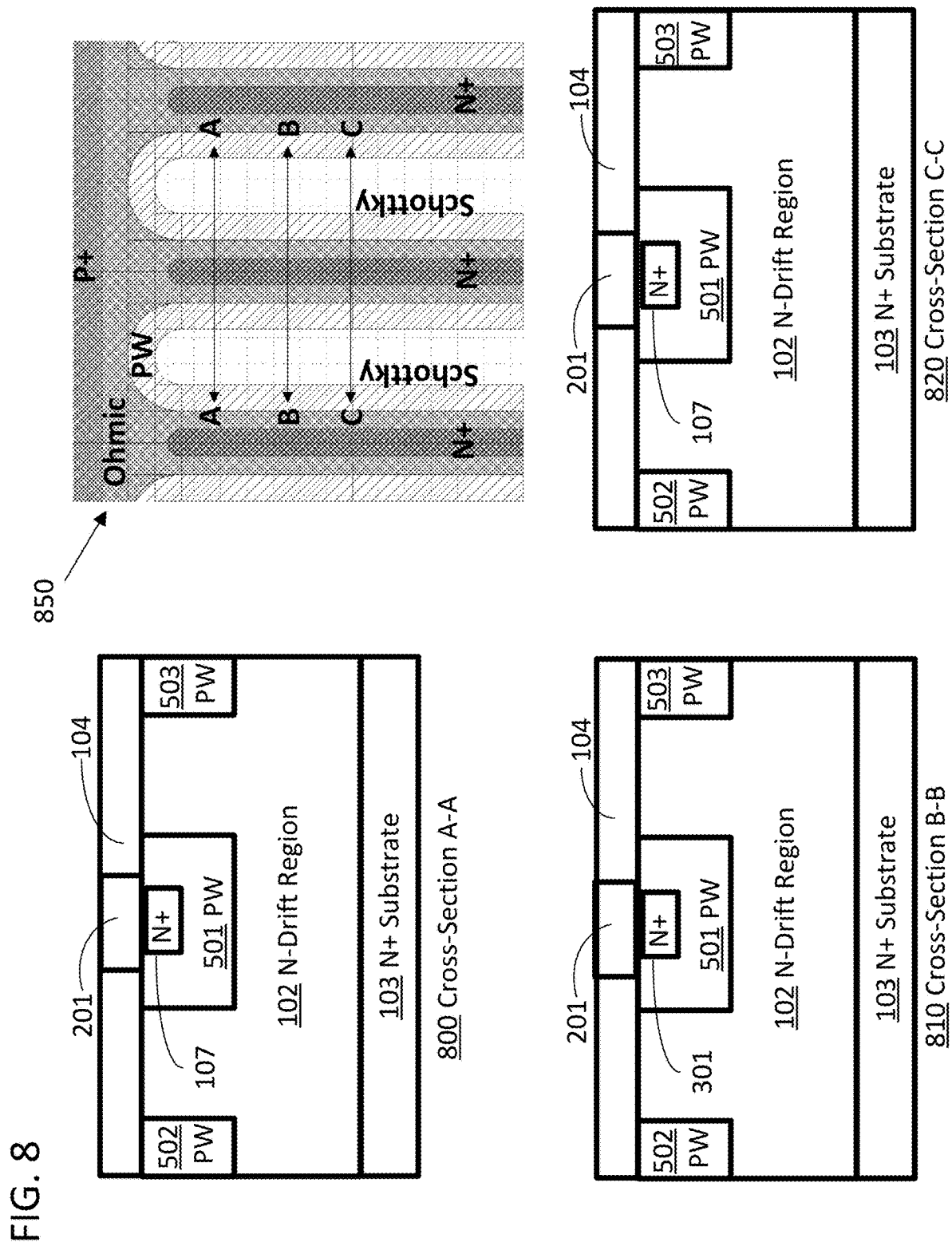
FIG. 8 includes a top-down view and three cross sections of a vertical diode device having a set of fingers with well doping concentration and a set of tap region strips with ohmic contacts in accordance with specific embodiments of the inventions disclosed herein.

FIG. 8 includes a top-down view 850 and three cross sections of a vertical diode device having a set of fingers with well doping concentration and a set of tap region strips with ohmic contacts in accordance with specific embodiments of the inventions disclosed herein. The cross sections include cross section 800 along line A-A in top-down view 850, cross section 810 along line B-B in top-down view 850, and cross section 820 along line C-C in top-down view 850. In other vertical diodes, P+ doped and Schottky fingers alternate, and in the P+ regions, high implant dosages are necessary to reach dopant concentrations of $5\times10^{18}$ cm$^{-3}$ to $1\times10^{20}$ cm$^{-3}$. These heavy implants cause crystal defects at such high concentrations, which are prone to interacting with heavy ions, exacerbating the defects and possibly contributing to increased device leakage. This design uses lightly doped p-well fingers (e.g., region 501, region 502, and region 503) instead of P+ fingers in the junction barrier diode layout. The p-well fingers can be biased by a common connection to a more heavily doped region such as the P+ region shown in cross section 850. The concentration of p-type dopants in a p-well ranges from $1 \times 10^{17}$ cm$^{-3}$ to $4 \times 10^{18}$ cm$^{-3}$, which is more than an order of magnitude lower than the average P+ concentration. To produce a lower p-well dopant concentration, the ion implant dose is lowered. Crystal damage caused by ion implant is minimized when the ion dose is reduced. Devices that have less crystal damage are more likely to withstand the impacts of radiation. When the device is biased in the off-state, a depletion region extends from the p-well fingers (e.g., region 501, region 502, and region 503) through the N− epi (e.g., region 102) under the Schottky contact. The p-well region fingers therefore provide a similar effect to that of the P+ fingers of the approaches described above. Furthermore, during an ion event, the N+ strips (e.g., region 107) incorporated in the p-well fingers (e.g., region 501) provide continuous N+ taps for electrons and reduce the electric field (and hence lessen the temperature rise) close to the anode surface when the device is biased in the off-state. Thus, the device's radiation resistance is strengthened by preventing it from overheating. The N+ strips are an example of a tap region. The tap region or tap regions can have a dopant concentration of $5 \times 10^{18}$ cm$^{-3}$ to $1 \times 10^{20}$ cm$^{-3}$. Furthermore, in this example, improved surge current performance is achieved by using ohmic contacts on the p-well regions (e.g., ohmic contact region 201).

Figure 9:
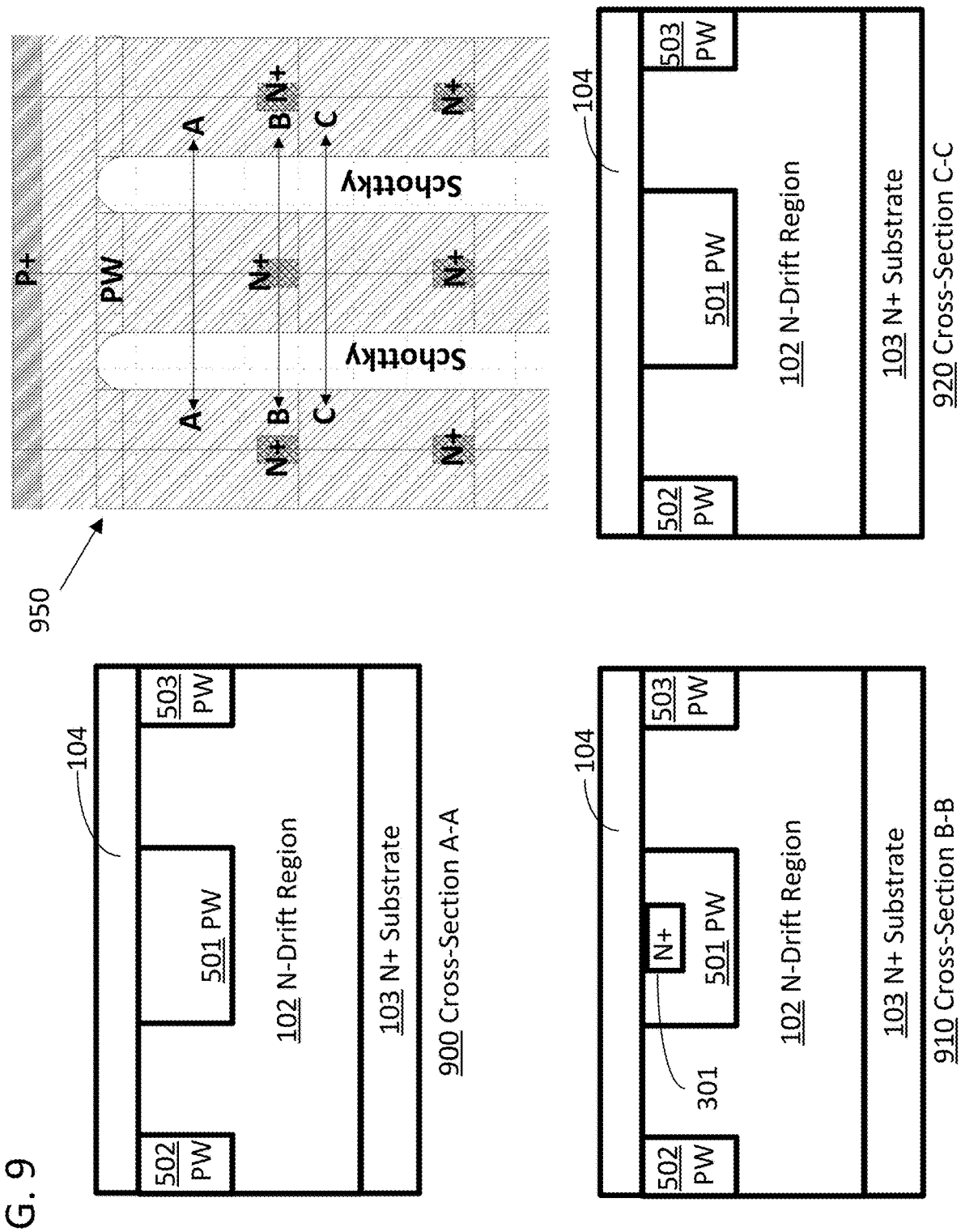
FIG. 9 includes a top-down view and three cross sections of a vertical diode device having a set of fingers with well doping concentration and a set of tap region islands in accordance with specific embodiments of the inventions disclosed herein.

FIG. 9 includes a top-down view 950 and three cross sections of a vertical diode device having a set of fingers with well doping concentration and a set of tap region islands in accordance with specific embodiments of the inventions disclosed herein. The cross sections include cross section 900 along line A-A in top-down view 950, cross section 910 along line B-B in top-down view 950, and cross section 920 along line C-C in top-down view 950. In other vertical diodes, P+ doped and Schottky fingers alternate, and in the P+ regions, high implant dosages are necessary to reach dopant concentrations of $5 \times 10^{18}$ cm$^{-3}$ to $1 \times 10^{20}$ cm$^{-3}$. These heavy implants cause crystal defects at such high concentrations, which are prone to interacting with heavy ions, exacerbating the defects and possibly contributing to increased device leakage. This design uses lightly doped p-well fingers (e.g., region 501, region 502, and region 503) instead of P+ fingers in the junction barrier diode layout. The p-well fingers can be biased by a common connection to a more heavily doped region such as the P+ region shown in cross section 950. The concentration of p-type dopants in a p-well ranges from $1 \times 10^{17}$ cm$^{-3}$ to $4 \times 10^{18}$ cm$^{-3}$, which is more than an order of magnitude lower than the average P+ concentration. To produce a lower p-well dopant concentration, the ion implant dose is lowered. Crystal damage caused by ion implant is minimized when the ion dose is reduced. Devices that have less crystal damage are more likely to withstand the impacts of radiation. When the device is biased in the off-state, a depletion region extends from the p-well fingers (e.g., region 501, region 502, and region 503) through the N− epi (e.g., region 102) under the Schottky contact. The p-well region fingers therefore provide a similar effect to that of the P+ fingers of the approaches described above. Furthermore, during an ion event, the N+ islands (e.g., region 301) incorporated in the p-well region (e.g., region 501) provide periodic N+ taps for electrons and reduce the electric field (and hence lessen the temperature rise) close to the anode surface when the device is biased in the off-state. Thus, the device's radiation resistance is strengthened by preventing it from overheating. The islands trade off reduced resistance of the p-well region for reduced radiation hardening as compared to the example of N+ strips described above.

Figure 10:
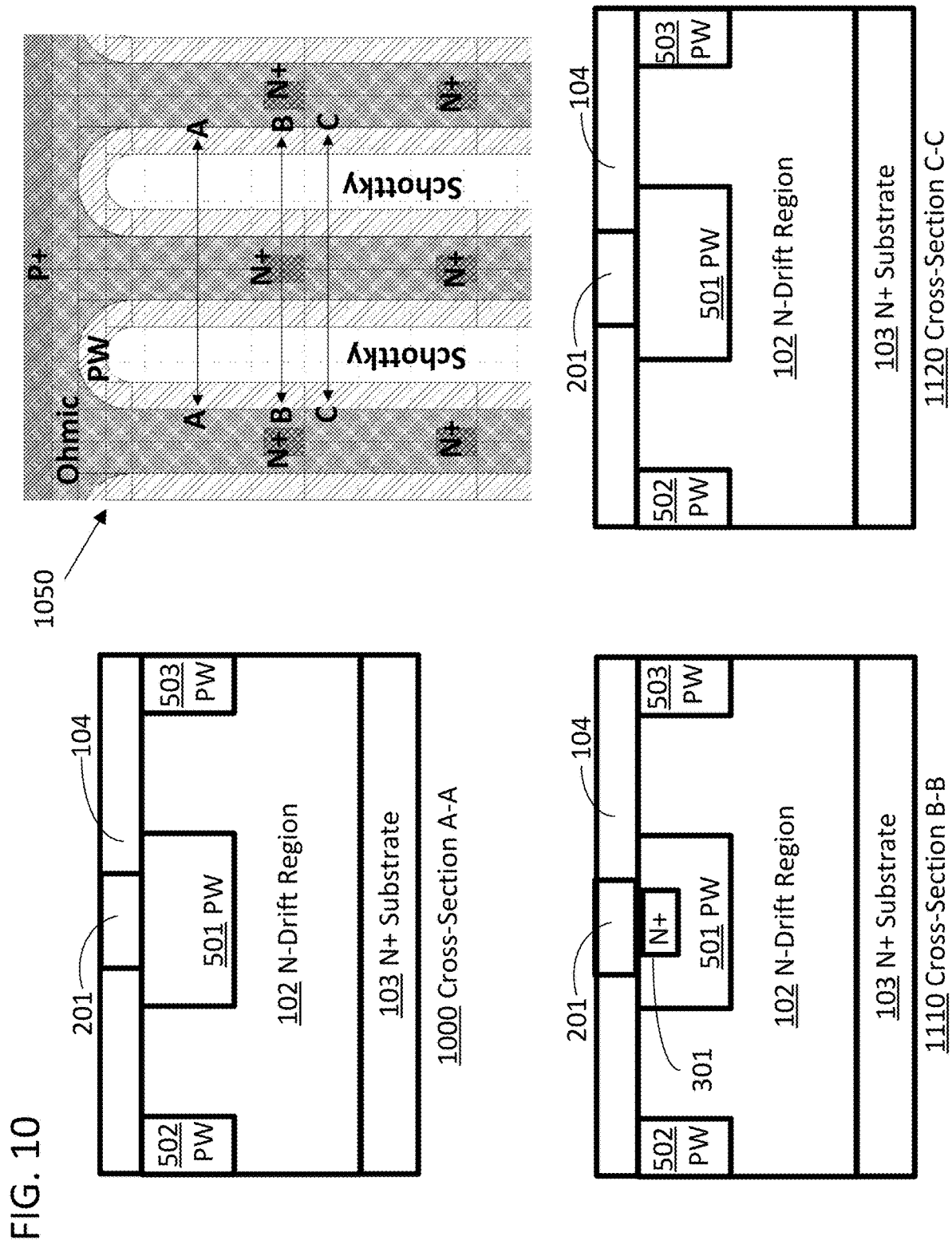
FIG. 10 includes a top-down view and three cross sections of a vertical diode device having a set of fingers with well doping concentration and a set of tap region islands with ohmic contacts in accordance with specific embodiments of the inventions disclosed herein.

FIG. 10 includes a top-down view 1050 and three cross sections of a vertical diode device having a set of fingers with well doping concentration and a set of tap region islands with ohmic contacts in accordance with specific embodiments of the inventions disclosed herein. The cross sections include cross section 1000 along line A-A in top-down view 1050, cross section 1010 along line B-B in top-down view 1050, and cross section 1020 along line C-C in top-down view 1050. In other vertical diodes, P+ doped and Schottky fingers alternate, and in the P+ regions, high implant dosages are necessary to reach dopant concentrations of $5 \times 10^{18}$ cm$^{-3}$ to $1 \times 10^{20}$ cm$^{-3}$. These heavy implants cause crystal defects at such high concentrations, which are prone to interacting with heavy ions, exacerbating the defects and possibly contributing to increased device leakage. This design uses lightly doped p-well fingers (e.g., region 501, region 502, and region 503) instead of P+ fingers in the junction barrier diode layout. The p-well fingers can be biased by a common connection to a more heavily doped region such as the P+ region shown in cross section 1050. The concentration of p-type dopants in a p-well ranges from $1 \times 10^{17}$ cm$^{-3}$ to $4 \times 10^{18}$ cm$^{-3}$, which is more than an order of magnitude lower than the average P+ concentration. To produce a lower p-well dopant concentration, the ion implant dose is lowered. Crystal damage caused by ion implant is minimized when the ion dose is reduced. Devices that have less crystal damage are more likely to withstand the impacts of radiation. When the device is biased in the off-state, a depletion region extends from the p-well fingers (e.g., region 501, region 502, and region 503) through the N− epi (e.g., region 102) under the Schottky contact. The p-well region fingers therefore provide a similar effect to that of the P+ fingers of the approaches described above. Furthermore, during an ion event, the N+ islands (e.g., region 301) incorporated in the p-well region (e.g., region 501) provide periodic N+ taps for electrons and reduce the electric field (and hence lessen the temperature rise) close to the anode surface when the device is biased in the off-state. Thus, the device's radiation resistance is strengthened by preventing it from overheating. The islands trade off reduced resistance of the p-well region for reduced radiation hardening as compared to the example of N+ strips described above. Furthermore, in this example, improved surge current performance is achieved by using ohmic contacts on the p-well regions (e.g., ohmic contact region 201).

Figure 11:
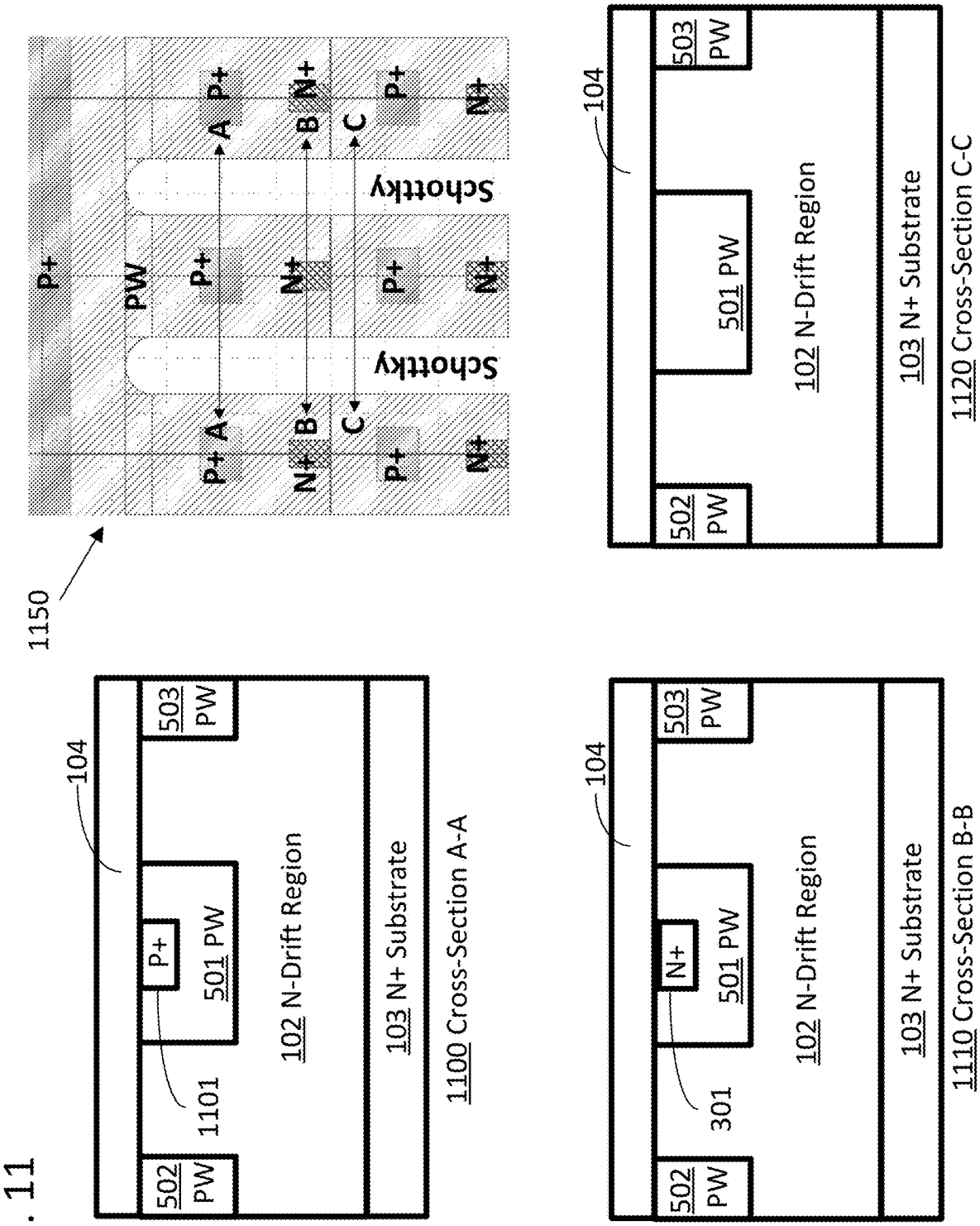
FIG. 11 includes a top-down view and three cross sections of a vertical diode device having a set of n-type islands and a set of p-type islands in accordance with specific embodiments of the inventions disclosed herein.

FIG. 11 includes a top-down view 1150 and three cross sections of a vertical diode device having a set of n-type islands and a set of p-type islands in accordance with specific embodiments of the inventions disclosed herein. The cross sections include cross section 1100 along line A-A in top-down view 1150, cross section 1110 along line B-B in top-down view 1150, and cross section 1120 along line C-C in top-down view 1150. In other vertical diodes, P+ doped and Schottky fingers alternate, and in the P+ regions, high implant dosages are necessary to reach dopant concentrations of $5 \times 10^{18}$ cm$^{-3}$ to $1 \times 10^{20}$ cm$^{-3}$. These heavy implants cause crystal defects at such high concentrations, which are prone to interacting with heavy ions, exacerbating the defects and possibly contributing to increased device leakage. This design uses lightly doped p-well fingers (e.g., region 501, region 502, and region 503) instead of P+ fingers in the junction barrier diode layout. The p-well fingers can be biased by a common connection to a more heavily doped region such as the P+ region shown in cross section 1150. The concentration of p-type dopants in a p-well ranges from $1\times10^{17}$ cm$^{-3}$ to $4\times10^{18}$ cm$^{-3}$, which is more than an order of magnitude lower than the average P+ concentration. To produce a lower p-well dopant concentration, the ion implant dose is lowered. Crystal damage caused by ion implant is minimized when the ion dose is reduced. Devices that have less crystal damage are more likely to withstand the impacts of radiation. When the device is biased in the off-state, a depletion region extends from the p-well fingers (e.g., region 501, region 502, and region 503) through the N– epi (e.g., region 102) under the Schottky contact. The p-well region fingers therefore provide a similar effect to that of the P+ fingers of the approaches described above. Furthermore, during an ion event, the N+ islands (e.g., region 301) incorporated in the p-well region (e.g., region 501) provide periodic N+ taps for electrons and reduce the electric field (and hence lessen the temperature rise) close to the anode surface when the device is biased in the off-state. Thus, the device's radiation resistance is strengthened by preventing it from overheating. The islands trade off reduced resistance of the p-well region for reduced radiation hardening as compared to the example of N+ strips described above. Furthermore, in this example, improved contacts and a lower forward bias voltage are achieved by using contacts provided by P+ islands implanted in the p-well (e.g., region 1101). The P+ islands increase the potential for crystal defects and the commensurate sensitivity to radiation impact damage but offset this risk with a reduced forward bias voltage and surge protection for the diode.

Figure 12:
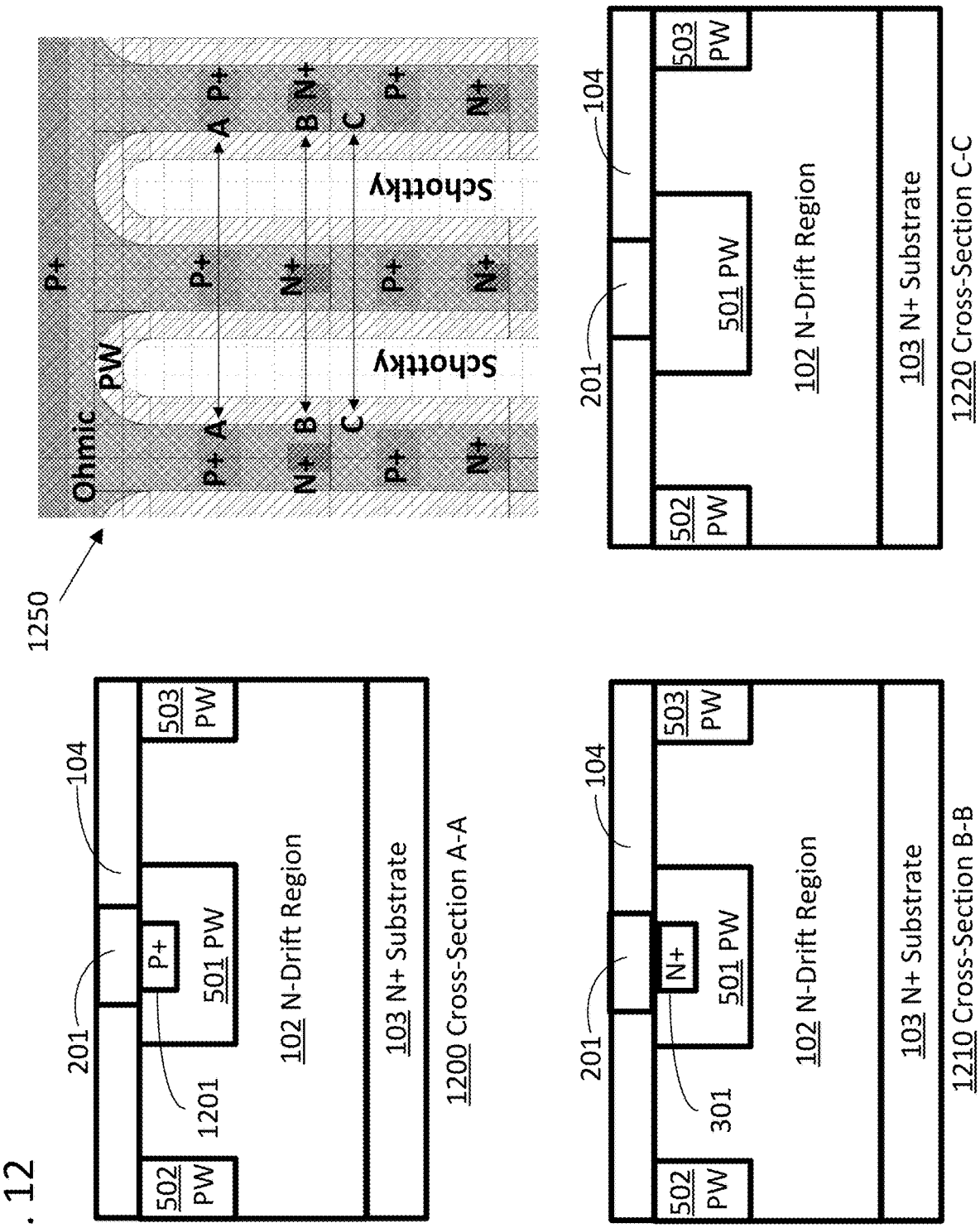
FIG. 12 includes a top-down view and three cross sections of a vertical diode device having a set of n-type islands and a set of p-type islands with ohmic contacts in accordance with specific embodiments of the inventions disclosed herein.

FIG. 12 includes a top-down view 1250 and three cross sections of a vertical diode device having a set of n-type islands and a set of p-type islands with ohmic contacts in accordance with specific embodiments of the inventions disclosed herein. The cross sections include cross section 1200 along line A-A in top-down view 1250, cross section 1210 along line B-B in top-down view 1250, and cross section 1220 along line C-C in top-down view 1250. In other vertical diodes, P+ doped and Schottky fingers alternate, and in the P+ regions, high implant dosages are necessary to reach dopant concentrations of $5\times10^{18}$ cm$^{-3}$ to $1\times10^{20}$ cm$^{-3}$. These heavy implants cause crystal defects at such high concentrations, which are prone to interacting with heavy ions, exacerbating the defects and possibly contributing to increased device leakage. This design uses lightly doped p-well fingers (e.g., region 501, region 502, and region 503) instead of P+ fingers in the junction barrier diode layout. The p-well fingers can be biased by a common connection to a more heavily doped region such as the P+ region shown in cross section 1250. The concentration of p-type dopants in a p-well ranges from $1\times10^{17}$ cm$^{-3}$ to $4\times10^{18}$ cm$^{-3}$, which is more than an order of magnitude lower than the average P+ concentration. To produce a lower p-well dopant concentration, the ion implant dose is lowered. Crystal damage caused by ion implant is minimized when the ion dose is reduced. Devices that have less crystal damage are more likely to withstand the impacts of radiation. When the device is biased in the off-state, a depletion region extends from the p-well fingers (e.g., region 501, region 502, and region 503) through the N– epi (e.g., region 102) under the Schottky contact. The p-well region fingers therefore provide a similar effect to that of the P+ fingers of the approaches described above. Furthermore, during an ion event, the N+ islands (e.g., region 301) incorporated in the p-well region (e.g., region 501) provide periodic N+ taps for electrons and reduce the electric field (and hence lessen the temperature rise) close to the anode surface when the device is biased in the off-state. Thus, the device's radiation resistance is strengthened by preventing it from overheating. The islands trade off reduced resistance of the p-well region for reduced radiation hardening as compared to the example of N+ strips described above. Furthermore, in this example, improved contacts and a lower forward bias voltage are achieved by using contacts provided by P+ islands implanted in the p-well (e.g., region 1101). The P+ islands increase the potential for crystal defects and the commensurate sensitivity to radiation impact damage but offset this risk with a reduced forward bias voltage and surge protection for the diode. Furthermore, in this example, improved surge current performance is achieved by using ohmic contacts on the p-well regions (e.g., ohmic contact region 201).

What is claimed is:

1. A vertical diode comprising:
a first region with a first conductivity type;
a set of fingers with a second conductivity type and located in a top portion of the first region;
at least one tap region with the first conductivity type formed in the set of fingers;
a metal layer located over and in contact with the first region, located over and in contact with the set of fingers, and forming a Schottky barrier with the first region of the first conductivity type; and
a depletion region that extends between the fingers in the set of fingers through the first region and under the Schottky barrier when the vertical diode is off.

2. The vertical diode of claim 1, wherein:
the first region is a drift region;
the drift region is an epitaxy region formed on a substrate;
the substrate is silicon carbide;
the first conductivity type is n-type; and
the second conductivity type is p-type.

3. A vertical diode, comprising:
a first region with a first conductivity type;
a set of fingers with a second conductivity type and located in a top portion of the first region;
at least one tap region with the first conductivity type formed in the set of fingers; and
a metal layer located over and in contact with the first region, located over and in contact with the set of fingers, and forming a Schottky barrier with the first region of the first conductivity type;
wherein the at least one tap region includes a set of tap region strips; and
wherein the set of tap region strips and the set of fingers are in a one-to-one correspondence with each tap region strip in the set of tap region strips surrounded by a finger in the set of fingers on three sides.

4. A vertical diode, comprising:
a first region with a first conductivity type;
a set of fingers with a second conductivity type and located in a top portion of the first region;
at least one tap region with the first conductivity type formed in the set of fingers; and
a metal layer located over and in contact with the first region, located over and in contact with the set of fingers, and forming a Schottky barrier with the first region of the first conductivity type;
wherein the at least one tap region includes a set of tap region islands; and
wherein the set of tap region islands and the set of fingers are in a plurality-to-one correspondence with each tap region island in the set of tap region islands surrounded by a finger in the set of fingers on five sides.

5. The vertical diode of claim 4, further comprising:
at least one ohmic contact region in the metal layer; and
wherein the at least one ohmic contact region is over and in contact with the at least one tap region.

6. The vertical diode of claim 5, wherein:
the at least one ohmic contact region is located over and in contact with the set of fingers.

7. The vertical diode of claim 5, wherein:
the metal layer is a mixed metal layer having a first metal in the at least one ohmic contact region and a second metal that forms the Schottky barrier with the first region.

8. A vertical diode, comprising:
a first region with a first conductivity type;
a set of fingers with a second conductivity type and located in a top portion of the first region;
at least one tap region with the first conductivity type formed in the set of fingers; and
a metal layer located over and in contact with the first region, located over and in contact with the set of fingers, and forming a Schottky barrier with the first region of the first conductivity type;
wherein the first region has a doping concentration of $1\times10^{15}$ cm$^{-3}$ to $5\times10^{16}$ cm$^{-3}$;
wherein the set of fingers have a doping concentration of $5\times10^{18}$ cm$^{-3}$ to $1\times10^{20}$ cm$^{-3}$; and
wherein the at least one tap region has a doping concentration of $5\times10^{18}$ cm$^{-3}$ to $1\times10^{20}$ cm$^{-3}$.

9. A vertical diode comprising:
a first region with a first conductivity type;
a set of fingers with a second conductivity type, located in a top portion of the first region, and having a well doping concentration; and
a metal layer located over the first region and the set of fingers and forming a Schottky barrier with the first region;
wherein the first region with the first conductivity type has a dopant concentration of $1\times10^{15}$ cm$^{-3}$ to $5\times10^{16}$ cm$^{-3}$; and
wherein the well doping concentration is $1\times10^{17}$ cm$^{-3}$ to $4\times10^{18}$ cm$^{-3}$.

10. The vertical diode of claim 9, wherein:
the metal layer forms a Schottky barrier with an entire top surface of the set of fingers along a cross section of the vertical diode.

11. The vertical diode of claim 9, wherein:
the set of fingers are a set of p-well fingers; and
the first region of the first conductivity type is an n-drift region.

12. The vertical diode of claim 9, further comprising:
at least one ohmic contact region formed in the metal layer;
wherein the at least one ohmic contact region is over and in contact with the set of fingers.

13. A vertical diode comprising:
a first region with a first conductivity type;
a set of fingers with a second conductivity type, located in a top portion of the first region, and having a well doping concentration; and
a metal layer located over the first region and the set of fingers and forming a Schottky barrier with the first region; and
at least one tap region with the first conductivity type formed in the set of fingers;
wherein the at least one tap region has a dopant concentration of $5\times10^{18}$ cm$^{-3}$ to $1\times10^{20}$ cm$^{-3}$.

14. A vertical diode comprising:
a first region with a first conductivity type;
a set of fingers with a second conductivity type, located in a top portion of the first region, and having a well doping concentration; and
a metal layer located over the first region and the set of fingers and forming a Schottky barrier with the first region; and
at least one tap region with the first conductivity type formed in the set of fingers;
wherein the at least one tap region includes a set of tap region strips; and
wherein the set of tap region strips and the set of fingers are in a one-to-one correspondence with each tap region strip in the set of tap region strips surrounded by a finger in the set of fingers on three sides.

15. A vertical diode comprising:
a first region with a first conductivity type;
a set of fingers with a second conductivity type, located in a top portion of the first region, and having a well doping concentration; and
a metal layer located over the first region and the set of fingers and forming a Schottky barrier with the first region; and
at least one tap region with the first conductivity type formed in the set of fingers;
wherein the at least one tap region includes a set of tap region islands; and
wherein the set of tap region islands and the set of fingers are in a plurality-to-one correspondence with each tap region island in the set of tap region islands surrounded by a finger in the set of fingers on five sides.

16. A vertical diode comprising:
a first region with a first conductivity type;
a set of fingers with a second conductivity type, located in a top portion of the first region, and having a well doping concentration; and
a metal layer located over the first region and the set of fingers and forming a Schottky barrier with the first region;
at least one tap region with the first conductivity type formed in the set of fingers; and
at least one contact region with the second conductivity type formed in the set of fingers;
wherein the at least one tap region includes a set of tap region islands;
wherein the at least one contact region with the second conductivity type includes a set of contact region islands;
wherein the set of tap region islands and the set of fingers are in a plurality-to-one correspondence with each tap region island in the set of tap region islands surrounded by a finger in the set of fingers on five sides; and
wherein the set of contact region islands and the set of fingers are in a plurality-to-one correspondence with each contact region island in the set of contact region islands surrounded by a finger in the set of fingers on five sides.

17. A vertical diode comprising:
a first region with a first conductivity type;
a set of fingers with a second conductivity type, located in a top portion of the first region, and having a well doping concentration; and
a metal layer located over the first region and the set of fingers and forming a Schottky barrier with the first region;

wherein the fingers in the set of fingers have a width of between 2 microns and 5 microns; and wherein an inter-finger spacing in the set of fingers is between 1 micron and 3 microns.

\* \* \* \* \*